United States Patent [19]

Honkura et al.

[11] Patent Number: 5,468,522
[45] Date of Patent: Nov. 21, 1995

[54] METHOD OF MANUFACTURING A COMPOSITE MAGNETIC COMPONENT

[75] Inventors: Yoshinobu Honkura; Hiroyuki Toki; Toyokatsu Usami, all of Aichi, Japan

[73] Assignee: Aichi Steel Works, Ltd., Tokai, Japan

[21] Appl. No.: 113,895

[22] Filed: Aug. 31, 1993

[30] Foreign Application Priority Data

Aug. 31, 1992 [JP] Japan .................................. 4-257461
Aug. 31, 1992 [JP] Japan .................................. 4-257462

[51] Int. Cl.⁶ .................................................. B05D 3/06
[52] U.S. Cl. ..................... 427/597; 427/127; 427/256; 427/287; 427/427; 427/448; 427/449; 427/456
[58] Field of Search ..................... 427/127–132, 427/552, 555, 556, 256, 287, 422, 427, 448, 449, 456

[56] References Cited

U.S. PATENT DOCUMENTS 4,639,810  1/1987  Sakai .
4,664,941  5/1987  Washburn .
4,871,582  10/1989  Miyabayashi .
4,914,334  4/1990  Aso .
5,100,692  3/1992  Nakamura et al. .

FOREIGN PATENT DOCUMENTS 0140048   5/1985   European Pat. Off. .
0300511   1/1989   European Pat. Off. .
62-227095 10/1987  Japan .
64-59123  3/1989   Japan .
2-87014   3/1990   Japan .
2-161616  6/1990   Japan .

*Primary Examiner*—Bernard Pianalto
*Attorney, Agent, or Firm*—Oblon, Spivak, McClelland, Maier, & Neustadt

[57] ABSTRACT

A method of manufacturing composite magnetic component comprising: a magnetic member or a magnetic base member made of a magnetic material; and a non-magnetic region as a modified magnetic property section being provided in a portion of said magnetic member or magnetic base member in the entire thickness thereof and having a magnetic property modified though composition modified by means of irradiation of an energy beam.

10 Claims, 15 Drawing Sheets

METHOD OF MANUFACTURING A COMPOSITE MAGNETIC COMPONENT

BACKGROUND OF THE INVENTION

1. Field of the Invention

This invention relates to a composite magnetic component comprising a magnetic member or a magnetic base member, a portion of which has a non-magnetic region formed as a modified magnetic property section having the magnetic property modified through modification of physical property effected in the entire thickness thereof, and a method of manufacturing such composite magnetic component.

More specifically, the present invention relates to a yoke component with integral soft magnetic and non-magnetic parts in a magnetic application product, a portion of which being provided with a non-magnetic region formed as a magnetic flux blocking section having a magnetic flux blocking property through modification of physical property and a method of manufacturing such yoke component having the integral soft magnetic and non-magnetic parts provided with a magnetic flux blocking section.

Further, the present invention relates to a composite magnetic component for magnetic flux transmission, which can effectively transmit magnetic flux or other magnetic signals output from a magnetic scale or other magnetic signal output members to a magnetic sensor, as well as a method of manufacturing such composite magnetic component for magnetic flux transmission and a magnetic sensor device including such composite magnetic component for magnetic flux transmission.

2. Description of the Prior Art

FIGS. 1 and 2 show a yoke component with a magnetic flux blocking section in a magnetic application product and a method of manufacturing the same in a first prior art. In this prior art, a separate member H of a non-magnetic material corresponding to a non-magnetic region is welded by butt welding to a soft magnetic member M constituting a yoke.

In the yoke component and the method of manufacturing the same in the first prior art, since the non-magnetic separate member H is welded to the soft magnetic member M constituting the yoke, there is a notch K in each section of welded portion Y as shown in FIG. 1 to result in the reduction of the mechanical strength. In addition, the manufacture of such yoke components involve many steps and leads to a high cost.

FIGS. 3 and 4 show a fuel seal in an solenoid valve in a second prior art. This seal is effected with a resin member J enclosing a coil C and an O-ring O of rubber fitted in a recess formed in the resin member.

In the solenoid valve in the second prior art, since the seal is effected with the resin member J enclosing the coil C and the O-ring O, there is a problem of insufficient sealing that results when the pressure is increased to enhance the performance.

FIG. 5 shows a composite magnetic component for magnetic flux transmission in a third prior art. This component is disposed between a magnetic scale member SJ as an output member B having a magnetic scale and a magnetic sensor S, and transmits magnetic flux (as shown by dashed lines in FIG. 5). As to this component, a member HB of a non-magnetic material corresponding to a non-magnetic region is bonded to a soft magnetic base member SM, as shown in FIG. 6 or 7.

In the composite magnetic component for magnetic flux transmission in the third prior art, since the member HB of the non-magnetic material is bonded to the base member SM, there is a notch SK in each bonded section BD as shown in FIG. 8 to result in the deterioration of the mechanical strength.

FIG. 9 shows a magnetic component for magnetic flux transmission in a fourth prior art. In this instance, not only a portion of the component corresponding to a magnetic sensor but also the entire component is constituted by a non-magnetic material HB.

Since the composite magnetic component for magnetic flux transmission in the fourth prior art is entirely constituted by the non-magnetic material, there is a problem in the aspect of the cost. For instance, the cost in case of SUS 304 is about four times as much as that of a usual iron type material.

SUMMARY OF THE INVENTION

A technical concept underlying the present invention, as contrived by the present inventors, is to provide a portion of a magnetic member or a magnetic base member with a non-magnetic region having the magnetic property thereof modified through modification of physical property effected in the entire thickness. Another technical concept underlying the present invention, which was obtained as a result of continual researches and investigations, is to make a portion of a yoke component, which is required to have a magnetic flux blocking property, non-magnetic through composition modification. A further technical concept underlying the present invention is to make a portion of a composite magnetic component of an iron type material for magnetic flux transmission, which faces a magnetic sensor, non-magnetic through modification of physical property.

An object of the present invention is to enhance the mechanical strength of a composite magnetic component.

Another object of the present invention is to reduce the cost of a composite magnetic component and also the manufacture thereof.

A further object of the present invention is to ensure the sufficient seal in a solenoid valve.

A still further object of the present invention is to permit highly sensitive and accurate measurement with sensor yokes.

A yet further object of the present invention is to provide a composite magnetic component comprising a magnetic member made of a magnetic material, a portion of which has a non-magnetic region as a modified magnetic property section having the magnetic property modified from those of the magnetic member through modification of physical property in the entire thickness thereof.

A yet further object of the present invention is to provide a composite magnetic component having the modified magnetic property section constituted by a magnetic flux blocking section having a magnetic flux blocking property, A yet further object of the present invention is to provide a composite magnetic component having the modified magnetic property section constituted by a magnetic flux transmitting section with variable magnetic flux transmission.

A yet further object of the present invention is to provide a yoke component constituting a magnetic member in a magnetic application product made of a soft magnetic iron alloy, in which the yoke component has integral soft magnetic and non-magnetic parts and a non-magnetic region formed in a portion thereof as a magnetic flux blocking section through modification of physical property in the entire thickness direction normal to the direction of magnetic flux to be formed.

A yet further object of the present invention is to provide a composite magnetic component for magnetic flux transmission, which comprises an output member for outputting a magnetic signal, a magnetic sensor for detecting the magnetic signal disposed so as to face the output member, and a magnetic member disposed between the output member and the magnetic sensor, wherein the magnetic member has a portion facing the magnetic sensor which is provided with an integral non-magnetic region for magnetic flux transmission through modification of physical property.

A yet further object of the present invention is to provide a magnetic sensor device, which comprises an output member for outputting a magnetic signal, a magnetic sensor for detecting the magnetic signal disposed so as to face the output member, and a magnetic flux control member disposed between the output member and the magnetic sensor and having an integral non-magnetic region for magnetic flux transmission formed by irradiating an energy beam to at least a portion of the magnetic flux control member facing the magnetic sensor.

A yet further object of the present invention is to provide a method of manufacturing a composite magnetic component, in which a portion of a magnetic base member made of a magnetic material is formed with a non-magnetic region as a modified magnetic property section with the magnetic property modified from those of the magnetic base member in the entire thickness by irradiating an energy beam to the portion of the magnetic base member while feeding a feed metal for forming the non-magnetic region to the portion thereof.

A yet further object of the present invention is to provide a method of manufacturing a yoke component with integral soft magnetic and non-magnetic parts having a magnetic flux blocking section, in which a portion of the yoke component made of a soft magnetic iron alloy constituting the magnetic base member is provided with a non-magnetic region having a magnetic flux blocking property by making the portion of the yoke component non-magnetic in the thickness direction by irradiating a laser beam to the portion of the yoke component while feeding any one of Ni, Mn, Ni alloys, Mn alloys, Mn—Cr alloys, Ni—Cr alloys, Fe alloys and so on to the portion thereof.

A yet further object of the present invention is to provide a method of manufacturing a composite magnetic component having an integral non-magnetic region for magnetic flux transmission by irradiating a laser beam to a member made of an iron type magnetic material constituting the magnetic base member on at least a portion thereof facing a magnetic sensor while feeding a material containing any one of Ni, Ni alloys, Mn alloys, Mn—Cr alloys, Ni—Cr alloys, Fe alloys and so on to the portion thereof.

In the yoke component with the integral soft magnetic and non-magnetic parts having the magnetic flux blocking section according to the present invention, the non-magnetic region, which is formed through composition modification effected in the entire thickness direction normal to the direction of magnetic flux, blocks the magnetic flux.

In the method of manufacturing the yoke component with the integral soft magnetic and non-magnetic parts having the magnetic flux blocking section according to the present invention, a portion of the yoke component is formed as the non-magnetic region with the magnetic flux blocking property by making the portion of the yoke component non-magnetic in the thickness direction by irradiating a laser beam to the portion of the yoke component while feeding any one of Ni, Mn, Ni alloys, Mn alloys, Mn—Cr alloys, Ni—Cr alloys, Fe alloys, and so on to the portion thereof.

In the composite magnetic component for magnetic flux transmission according to the present invention, the non-magnetic region formed through composition modification effected in a portion of the component facing the magnetic sensor can readily transmit magnetic flux, which is a magnetic signal output from the output member, to the magnetic sensor.

In the method of manufacturing the composite magnetic component for magnetic flux transmission according to the present invention, the member made of the iron type magnetic material constituting the composite magnetic component for magnetic flux transmission is irradiated with a laser beam on at least a portion facing the magnetic sensor thereof to form a non-magnetic region for magnetic flux transmission while feeding any one of Ni, Mn, Ni alloys, Mn alloys, Mn—Cr alloys, Ni—Cr alloys, Fe alloys and so on to the portion thereof.

In the magnetic sensor device according to the present invention, the output member outputs magnetic flux, for instance, as a magnetic signal, and the non-magnetic region, which is provided to the magnetic flux control member disposed between the output member and the magnetic sensor in a portion facing the magnetic sensor thereof by irradiating an energy beam to the portion, readily transmits the magnetic flux output from the output member. Then, the magnetic sensor detects the transmitted magnetic flux.

The yoke component with the integral soft magnetic and non-magnetic parts having the magnetic flux blocking section according to the present invention has an effect of blocking the magnetic flux formed in the yoke through the non-magnetic region formed in the thickness direction normal to the direction of the magnetic flux through composition modification. In addition, unlike the prior art, such yoke component is formed without welding and is free of any notch, so that it has high mechanical strength. Further, since the base member is made of a soft magnetic iron alloy, it is possible to obtain the reduction of cost.

In the method of manufacturing the yoke component with the integral soft magnetic and non-magnetic parts having the magnetic flux blocking section according to the present invention, a portion of the yoke component is provided with the magnetic flux blocking section by making the portion of the yoke component non-magnetic in the thickness direction by irradiating a laser beam to the portion of the yoke component while feeding any one of Ni, Mn, Ni alloys, Mn alloys, Mn—Cr alloys, Ni—Cr alloys, Fe alloys and so on to the portion thereof. Thus, compared to the prior art method of manufacture, a number of steps is reduced, a product is given a superior finish is obtainable, and increased mechanical strength is increased.

In the composite magnetic component for magnetic flux transmission according to the present invention, the non-magnetic region, which is formed through composition modification, can readily transmit magnetic flux, for instance, as a magnetic signal output from the output member, to the magnetic sensor. It is thus possible to permit the magnetic sensor to detect changes in magnetic flux or other magnetic signals. In addition, since the non-magnetic region formed in a portion of the component facing the magnetic sensor is formed through composition modification of the base member, the product is free of notch, which leads to enhancement of mechanical strength, unlike the prior art, in which the non-magnetic region is formed by bonding. Further, it is possible to use an iron type general material for the base member, thus permitting the cost reduction in comparison with the case of the prior art base member which is made of a non-magnetic material.

In the method of manufacturing the composite magnetic component for magnetic flux transmission according to the present invention, a portion of the iron type magnetic material member, which faces the magnetic sensor, is provided with the non-magnetic region by irradiating a laser beam to the portion of the member while feeding any one of Ni, Mn, Ni alloys, Mn alloys, Mn—Cr alloys, Ni—Cr alloys, Fe alloys and so on to the portion thereof. Thus, compared to the prior art, in which the non-magnetic member is disposed at such a position as to face the magnetic sensor and is bonded to the soft magnetic member, the manufacture requires a reduced number of steps, and it is possible to obtain a product provided with superior finish and ensure increased mechanical strength.

In the magnetic sensor device according to the invention, the non-magnetic region formed by irradiating an energy beam to a portion of the magnetic flux control member can readily transmit the magnetic flux output from the output member to the magnetic sensor. Thus, it is possible to effectively detect changes in the magnetic flux or the like for obtaining highly accurate measurement. Further, since the magnetic flux control member has high mechanical strength compared to the prior art member, it is possible to make an application, under load, and also realize the reduction of cost.

BRIEF DESCRIPTION OF THE DRAWINGS

The foregoing and other objects and features of the invention will become apparent from the following description of preferred embodiments of the invention with reference to the accompanying drawings, in which.

DETAILED DESCRIPTION OF THE PREFERRED EMBODIMENTS

First Embodiment

Figure 10:
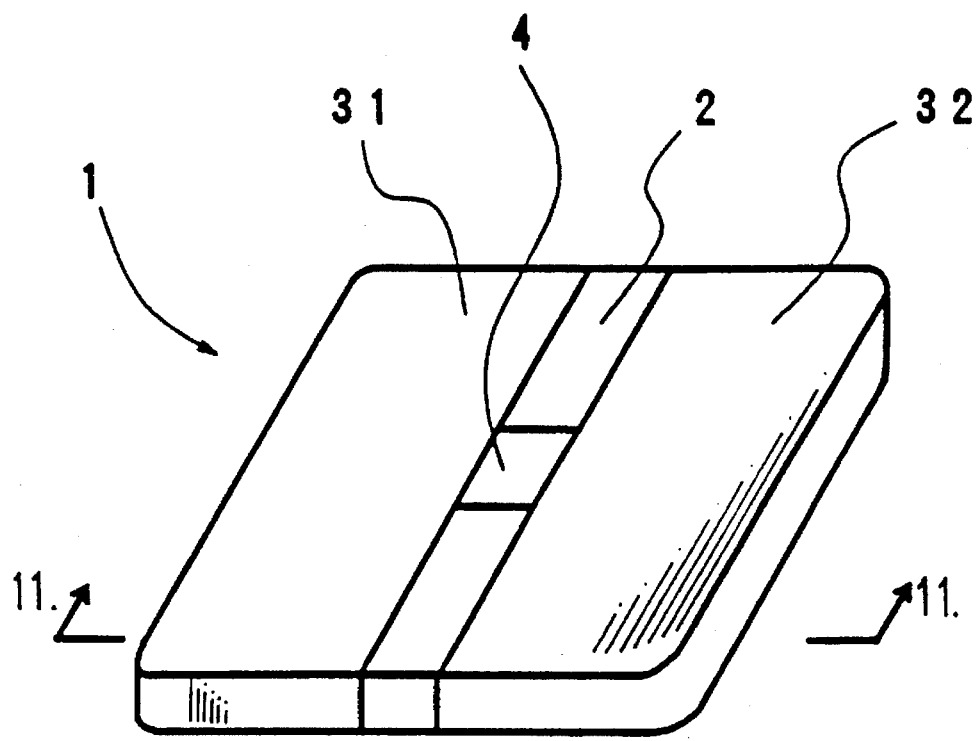
FIG. 10 is a perspective view showing a sensor yoke for a magnetic sensor as a first embodiment of the present invention.
Figure 11:
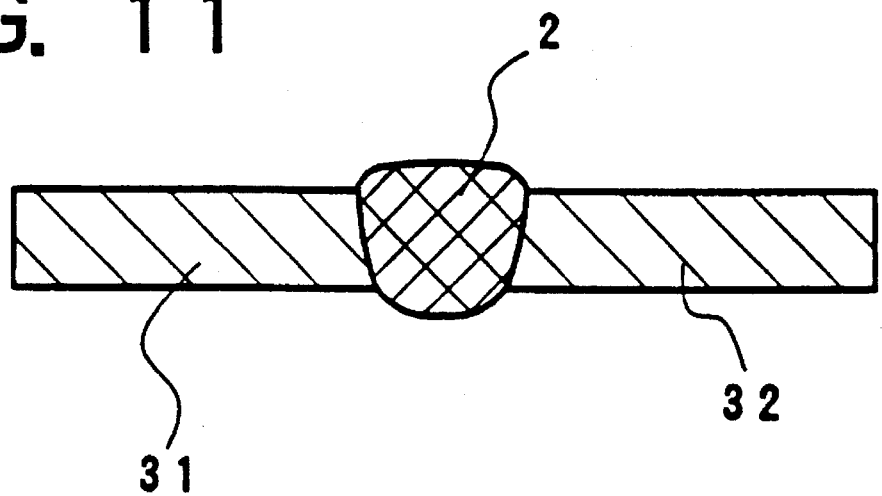
FIG. 11 is a cross-sectional view taken along line A—A in FIG. 10 and showing the sensor yoke as the first embodiment.

FIGS. 10 and 11 show a first embodiment of a composite magnetic component, which is applied as a yoke component to a magnetic sensor. The magnetic sensor comprises a substantially rectangular base member 1 made of a soft magnetic iron alloy. A central strip-like portion of the base member 1 is converted from an upper surface to a lower surface in the entire thickness to a non-magnetic region 2 through composition modification as the modification of physical property to form a pair of sensor yokes 31 and 32 located on the opposite sides of the non-magnetic region 2. A central portion of the non-magnetic region 2 is provided with a recess, in which a Hall element 4 or a magnetic reluctance element is disposed.

In the sensor yoke as the first embodiment having the above construction, in which the non-magnetic region 2 having a magnetic flux blocking property is formed in the central portion of the base member 1 in the entire thickness thereof, the pair of sensor yokes 31 and 32 facing each other on the opposite sides of the Hall element 4 or like element and the Hall element 4 effectively form a closed magnetic circuit to permit highly sensitive and accurate measurement.

Further, the first embodiment, unlike the prior art structure, is free of any welded or bonded section, and can ensure high mechanical strength. In addition, since the base member is made of a soft magnetic iron alloy, it is possible to reduce the cost.

Second Embodiment

Figure 12:
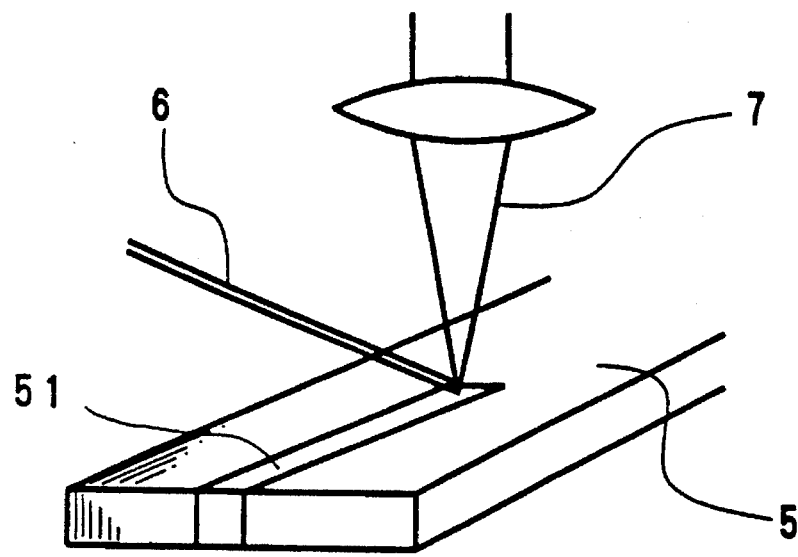
FIG. 12 is a perspective view for explaining a method of manufacturing a sensor yoke as a second embodiment of the present invention.

FIG. 12 shows a second embodiment concerning a method of manufacturing the yoke component of the sensor yokes in the first embodiment. As shown in FIG. 12, a 12 chromium type stainless steel strip 5 as a base member, which has a width corresponding to the width of the yoke component in the first embodiment and a thickness of 0.8 to 1.2 mm, is formed with a non-magnetic region 51 by irradiating a carbon dioxide gas laser beam 7 with 1,300 to 2,300 kW to a central longitudinal portion of the strip while feeding a Fe-45 Ni wire 6 with a diameter of 1 mm to the central longitudinal portion. The wire 6 is fed at a wire feeding rate of 1 to 3 mm/min., and the beam traveling velocity of the laser beam is 0.8 to 2.0 m/min.

The balance control for obtaining the non-magnetic region 51 should be neither excessive nor insufficient. Otherwise, the non-magnetic region 51 can not be formed. That is, it is necessary to provide for high degree balance control of the composition of the base member 5 irradiated with the laser beam, the composition of the wire 6 to be fed and the mixture ratio between the base member 5 and the wire 6.

Further, for controlling the quantity of heat input for composition modification to obtain the non-magnetic region 51, it is necessary to effect balance control in dependence on the power of the laser beam 7, the volume of a melted portion of the base member 5 in correspondence to the composition modification rate of the laser beam and the volume of the wire corresponding to the feed rate of the wire 6.

When the quantity of heat input is insufficient, the base member 5 is modified in composition only superficially. On the other hand, when the quantity of heat input is excessive, the resultant non-magnetic region sags down. When the quantity of heat input is appropriate, the composition modification is effected in the entire thickness of the base member requiring the composition modification, as shown in FIG. 11. Besides, the non-magnetic region does not sag.

The base member 5 of the yoke component may be of a soft magnetic Fe alloy, but it is also possible to use a Fe-42 Ni alloys, Fe-45 Ni alloys, or like materials.

The wire 6 for composition modification is any one of Ni, Mn, Ni alloys, Mn alloys, Mn—Cr alloys, Ni—Cr alloys, Fe alloys and so on.

According to the method of manufacture in the second embodiment having the above construction, it is possible to control the non-magnetic region 51 to the optimum composition by the composition modification using the laser beam, that is, it is possible to form the optimum non-magnetic region 51.

Further, since the method of manufacture in the second embodiment permits the formation of the non-magnetic region 51 through accurate scanning control of the laser beam 7, it is possible to form the non-magnetic region 51 with an accurate shape in response to the size and shape of the sensor yokes .and the state of distribution of the magnetic flux to be blocked.

Furthermore, in the method of manufacture in the second embodiment, it is possible to form by irradiation with the laser beam as shown in FIG. 12 the non-magnetic region 51 which corresponds to a plurality of yoke components, and then cut the system to a length corresponding to each yoke component. Thus, it is possible to reduce the cost of manufacture. Alternatively, cutting to each eventual yoke component may be done before irradiation of each eventual yoke component with the laser beam. Again in this case, it is possible to manufacture the yoke component inexpensively.

Third Embodiment

Figure 14:
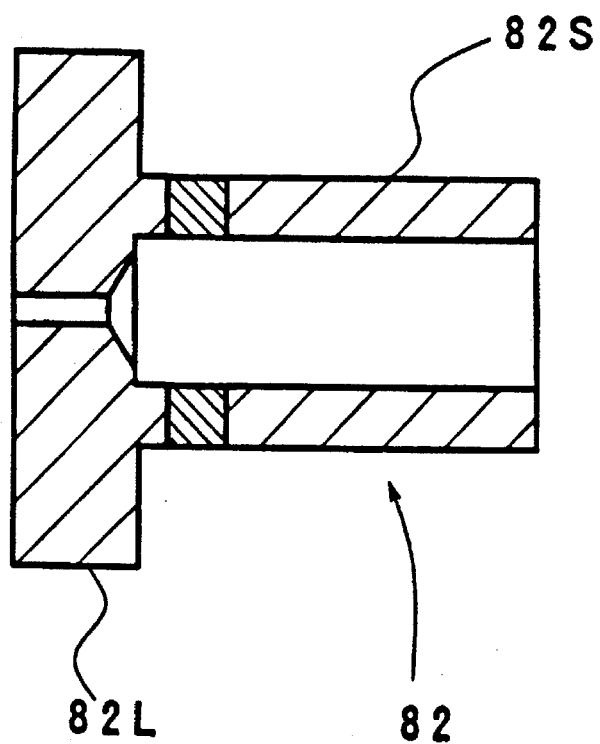
FIG. 14 is a longitudinal sectional view showing a yoke member of the solenoid valve as the third embodiment.
Figure 13:
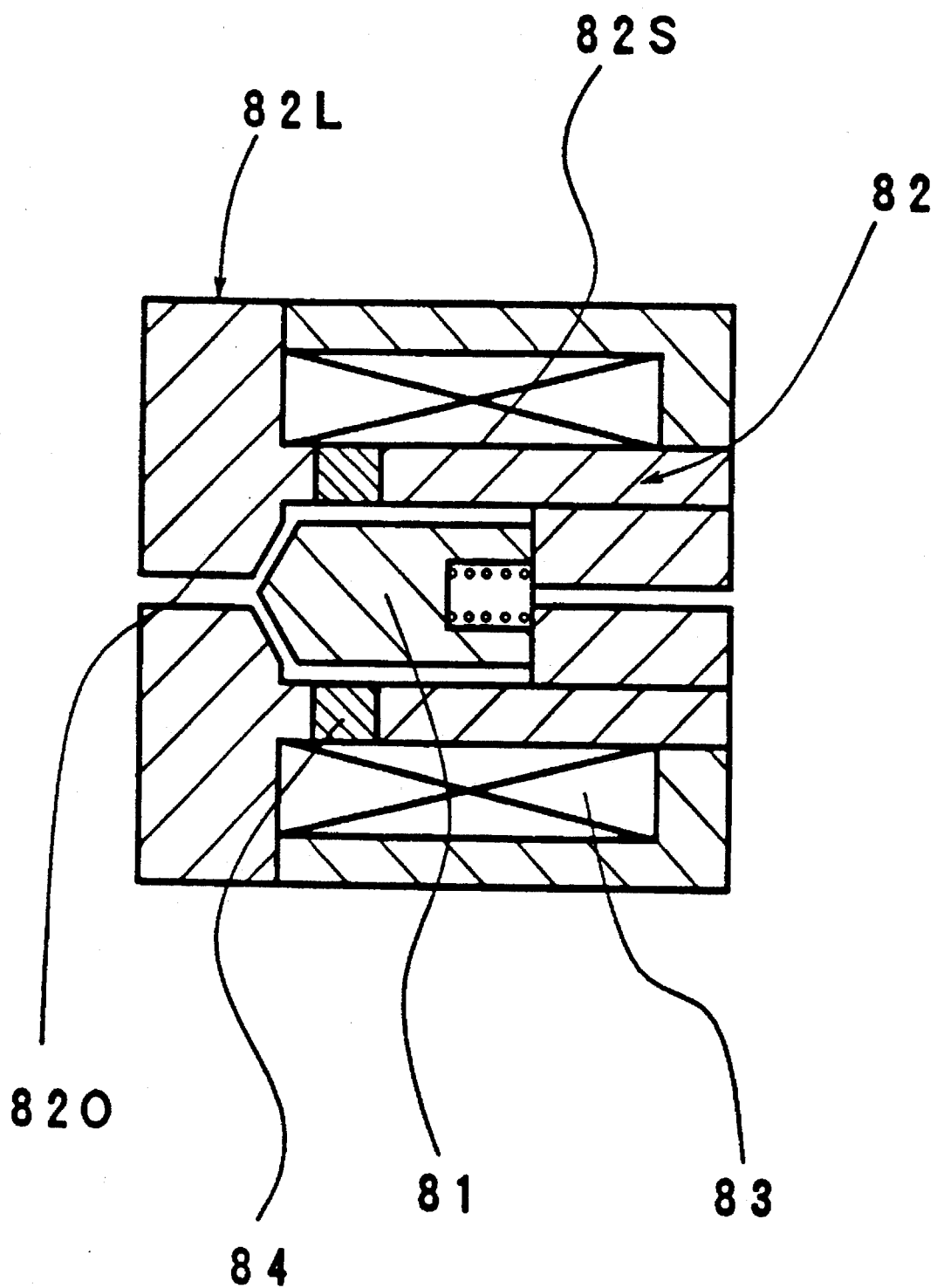
FIG. 13 is a longitudinal sectional view showing an solenoid valve as a third embodiment of the present invention.
Figure 15:
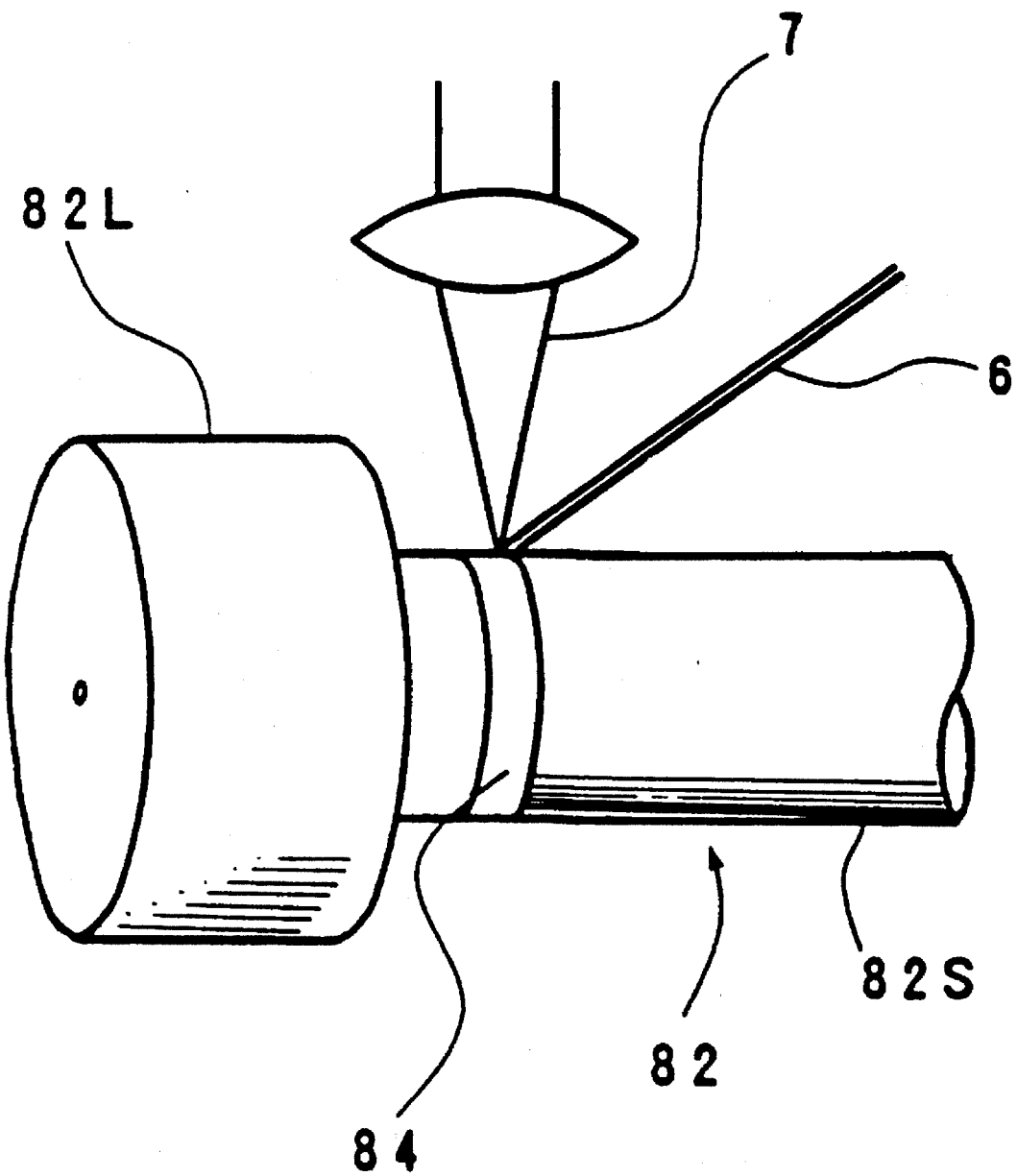
FIG. 15 is a perspective view showing a method of manufacturing the yoke member as the third embodiment.

FIGS. 13, 14 and 15 show an solenoid valve as a third embodiment of the present invention. The solenoid valve comprises a yoke member 82 made of a soft magnetic iron alloy and constituting a nozzle body, a movable member 81 inserted in and movable along the yoke member 82, a movable member drive coil 83 provided around the yoke member 82, and a seal section for control fluid 84 constituted by a non-magnetic region having a magnetic flux blocking property, which is provided to the yoke member 82 at a portion close to the end of the small diameter portion 82S thereof over a predetermined width in the entire thickness by irradiating an energy beam thereon.

The yoke member 82 is made of a soft magnetic material. A large diameter portion 82L of the yoke member at the tip end forms an outer wall of the solenoid valve and has a central port 820. The coil 83 is provided around a small diameter portion 82S of the yoke member to constitute part of a magnetic circuit. The movable member 81 constituting an armature is inserted in the small diameter portion 82S.

The yoke member 82 is a hollow cylindrical member made of 12 chromium type stainless steel and has a step or shoulder. As shown in FIG. 15, similar to the second embodiment, the carbon dioxide gas laser beam 7 is irradiated to the outer wall at a portion of the small diameter portion 82S near the large diameter portion 82L.

The movable member drive coil 83 is enclosed by an L-shaped member made of a soft magnetic material constituting part of the magnetic circuit.

The non-magnetic region as the seal section 84 is formed through composition modification of the aforementioned portion to a composition of 6Cr—18Ni alloys or 4Cr—25Ni alloys in the entire thickness and over the entire circumference by irradiating the laser beam with provision of a Ni or Fe—45Ni wire 6 as well to the aforementioned portion, while rotating the yoke member 82 at a predetermined angular speed.

Figure 1:
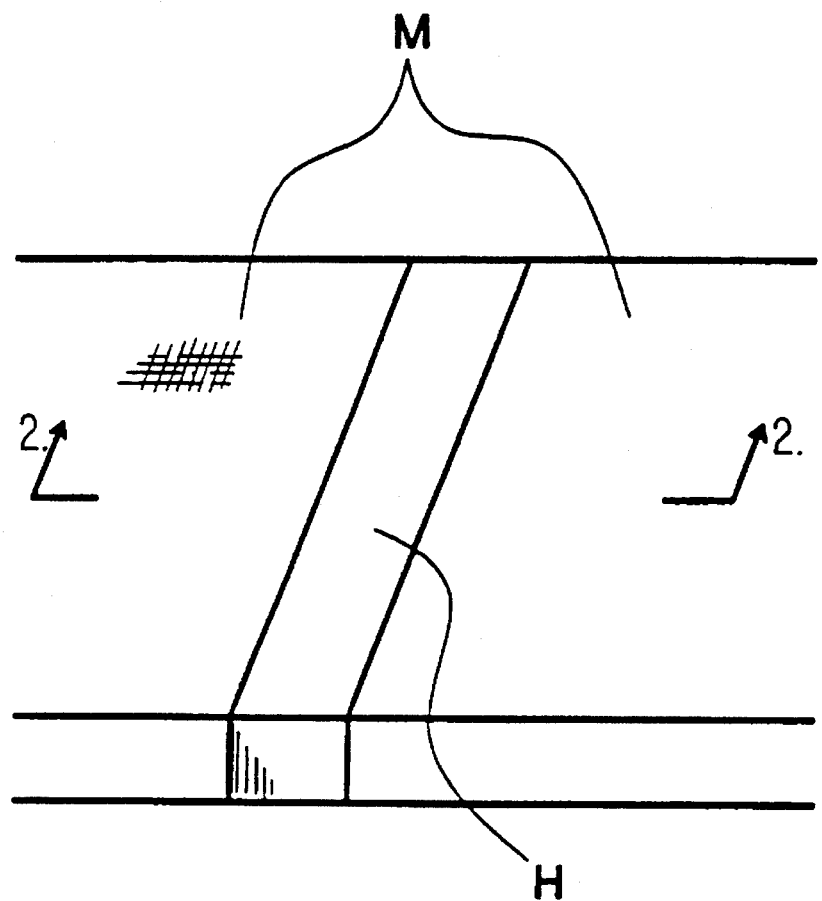
FIG. 1 is a perspective view showing a yoke component in a first prior art.
Figure 2:
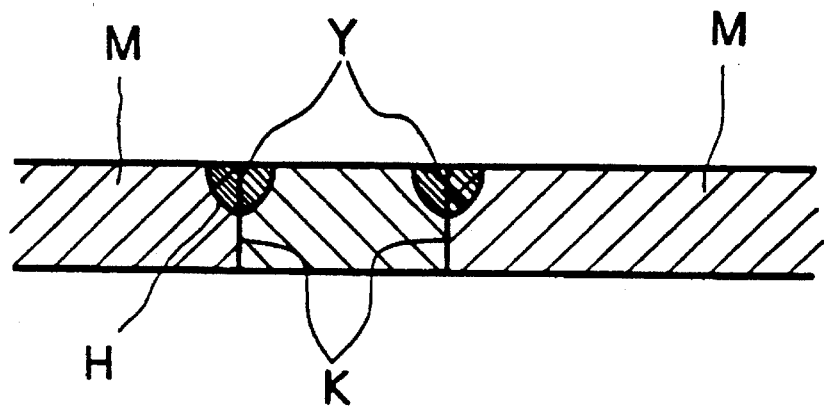
FIG. 2 is a cross-sectional view taken along line B—B in FIG. 1 and showing the state of section of weldment in the yoke component in the first prior art.
Figure 3:
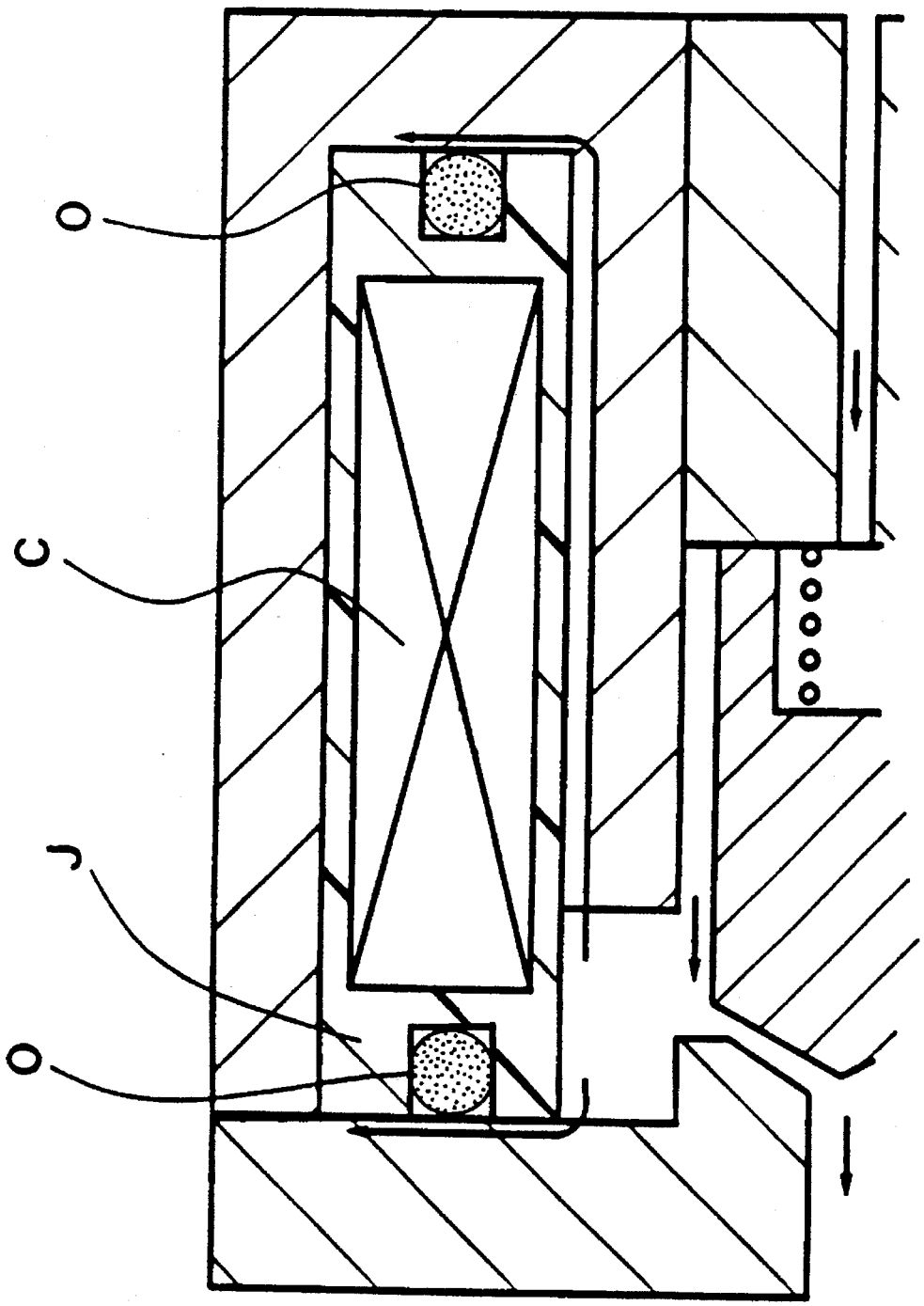
FIG. 3 is a longitudinal sectional view showing part of the structure of a solenoid valve in a second prior art.
Figure 4:
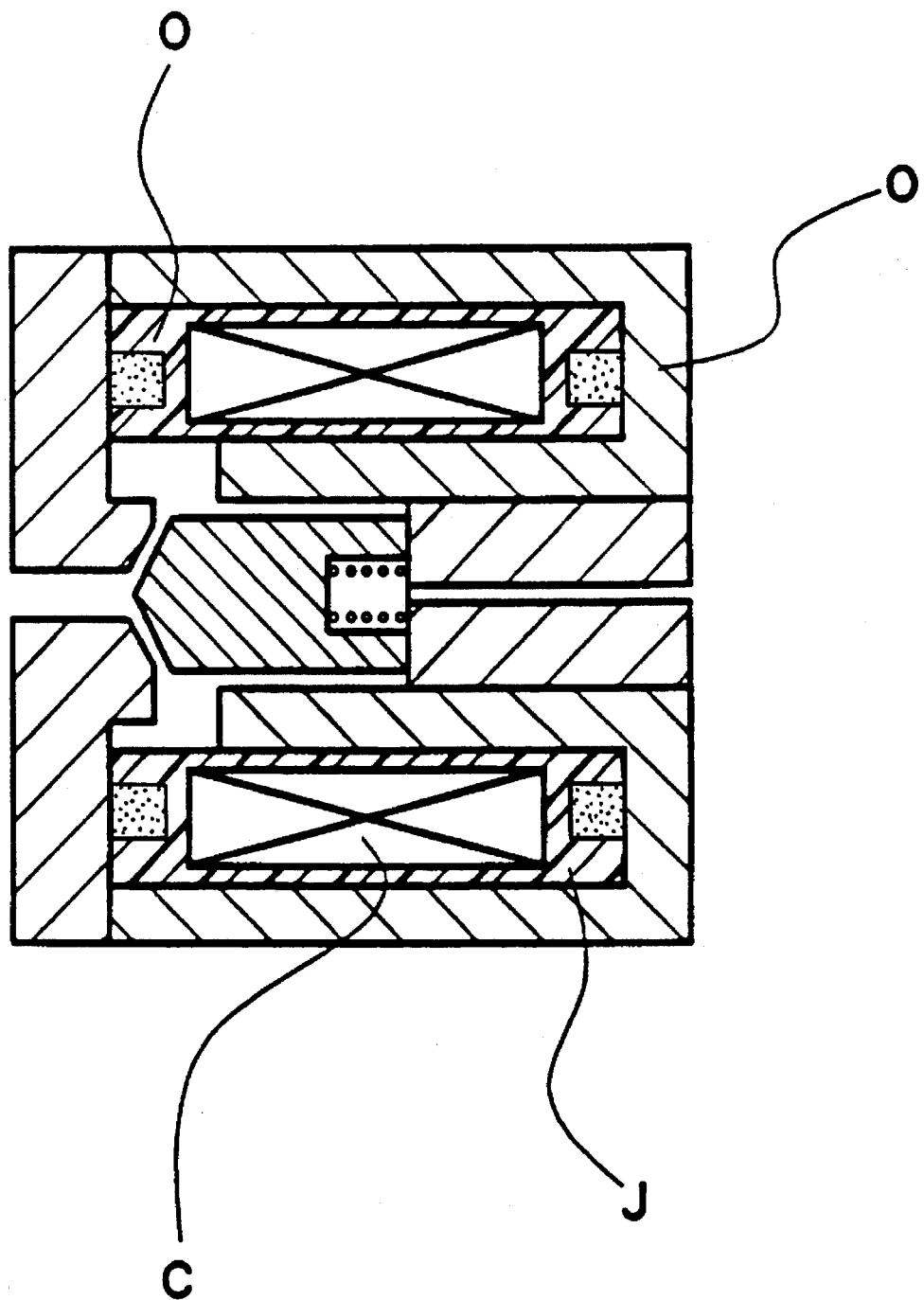
FIG. 4 is an enlarged-scale longitudinal sectional view showing part of the structure of the solenoid valve in the second prior art.
Figure 5:
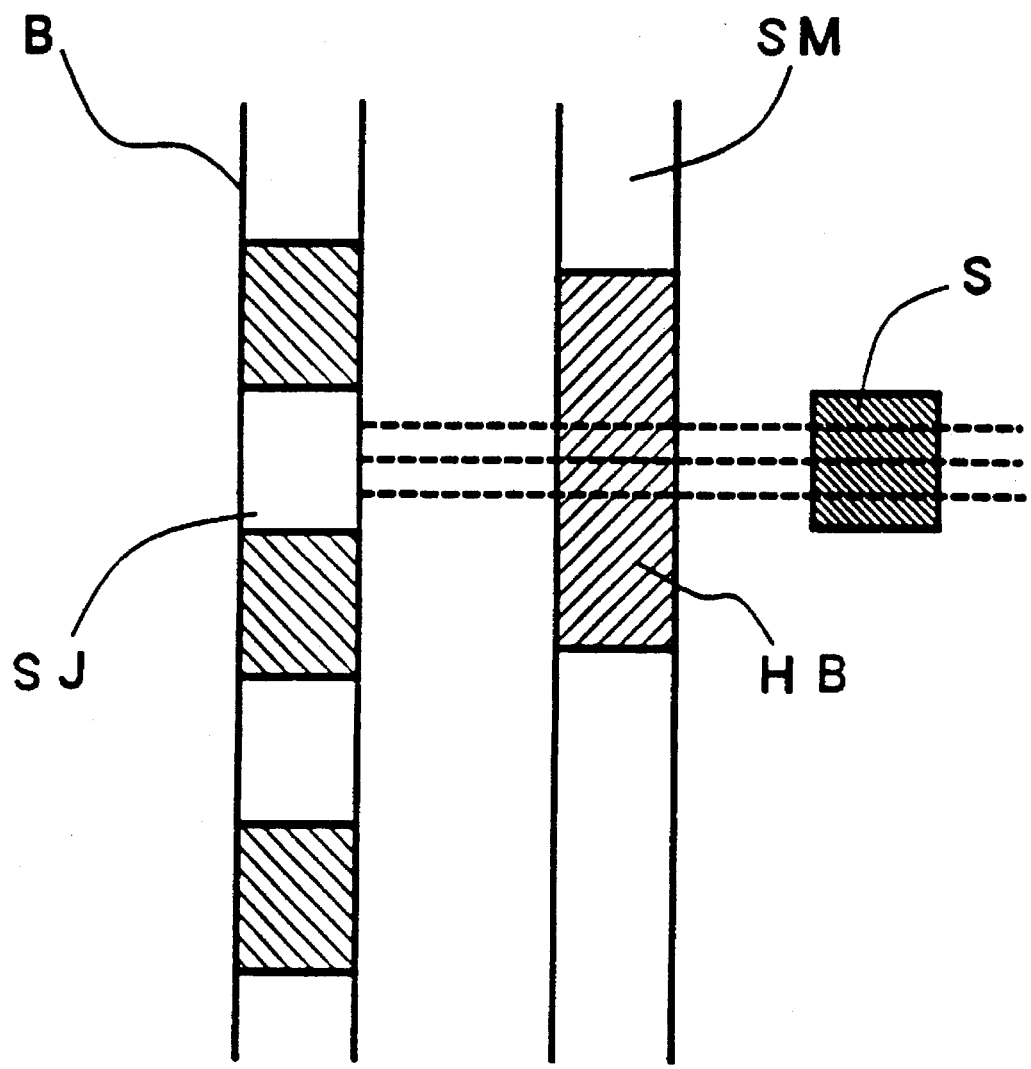
FIG. 5 is a cross-sectional view for explaining a magnetic component for magnetic flux transmission in a third prior art.
Figure 6:
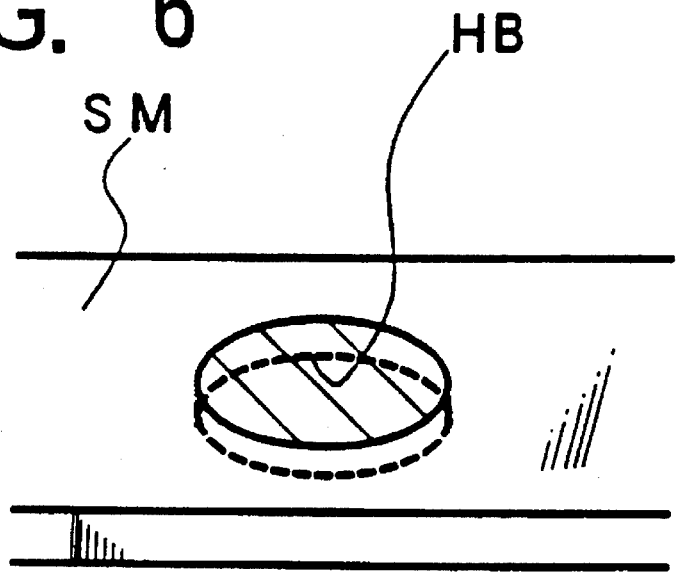
FIG. 6 is a perspective view showing a composite magnetic component for magnetic flux transmission in the third prior art.
Figure 7:
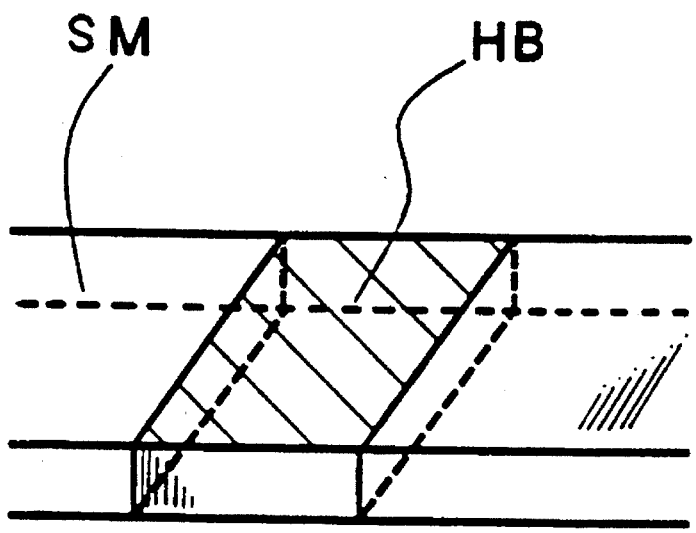
FIG. 7 is a perspective view showing another composite magnetic component for magnetic flux transmission in the third prior art.
Figure 8:
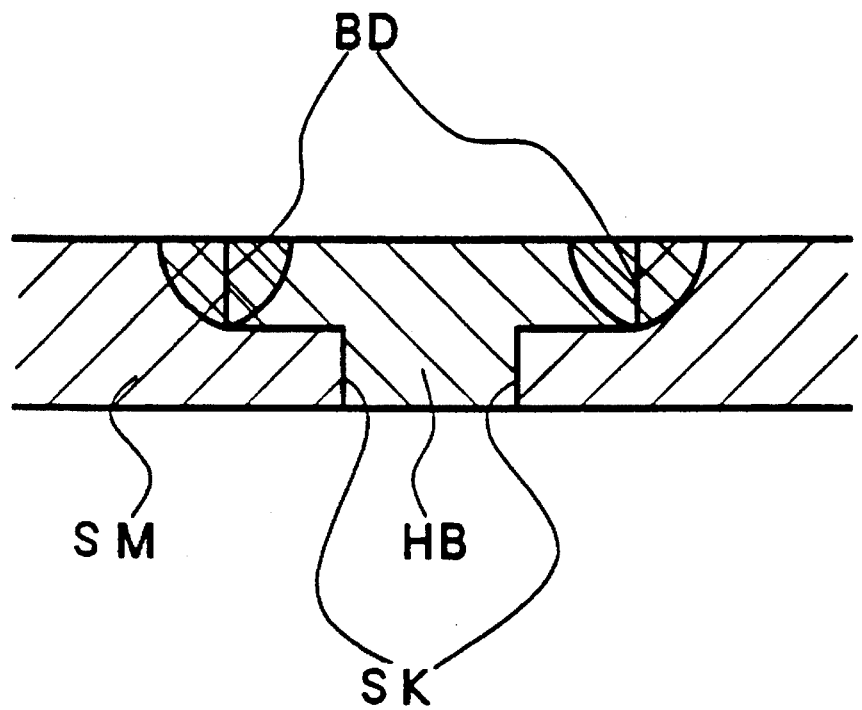
FIG. 8 is a cross-sectional view showing the state of a bonded section of the composite magnetic component for magnetic flux transmission in the third prior art.
Figure 9:
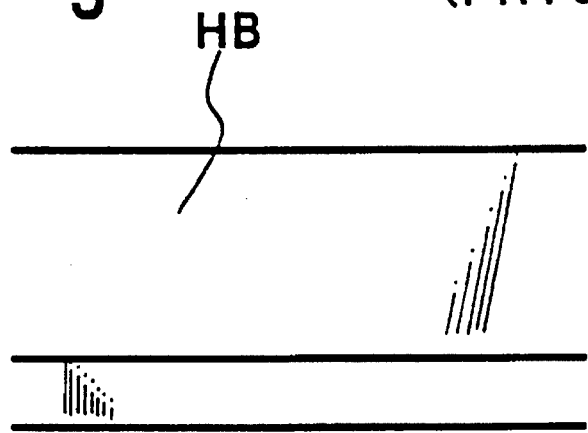
FIG. 9 is a perspective view showing a composite magnetic component for magnetic flux transmission in a fourth prior art.

In the solenoid valve as the third embodiment having the above construction, the yoke member 82, unlike the prior art structure shown in FIG. 4, is free of any air gap. In addition, while a magnetic circuit is formed in the solenoid valve in such a way as to surround the coil 83 when the coil 83 is driven by a drive signal, the non-magnetic region, which is formed as the seal section 84 in the yoke member 82 and has a magnetic flux blocking property, has an effect of blocking the magnetic flux to let the same be directed to the adjacent armature of a magnetic material. As a result, the movable member constituting the armature of a magnetic material forms part of the magnetic circuit. Thus, in the third embodiment the essential function as the solenoid valve and the seal is attained.

Further, the solenoid valve as the third embodiment having the above action has an effect of realizing seal with the seal section 84 formed in the yoke member 82. It is thus possible to realize sufficient sealing performance even in such a case as when the seal of fuel discharged from an air gap is insufficient with an O-ring made of rubber due to the increase of fuel pressure in a prior art apparatus.

Further, since the solenoid valve as the third embodiment has the seal section 84 which is provided through composition modification by irradiation with a laser beam to form the seal section integral with the yoke member 82, it has high mechanical strength and permits a use in which a load is applied.

Furthermore, in the solenoid valve as the third embodiment, since the yoke member 82 as the base member to be provided with the seal section 84 can be constituted by 12 chromium type stainless steel, it is possible to reduce the cost.

Further in the third embodiment the yoke member 82 may be obtained by composition modification to one part, instead of welding three parts in the prior art.

Fourth Embodiment

Figure 16:
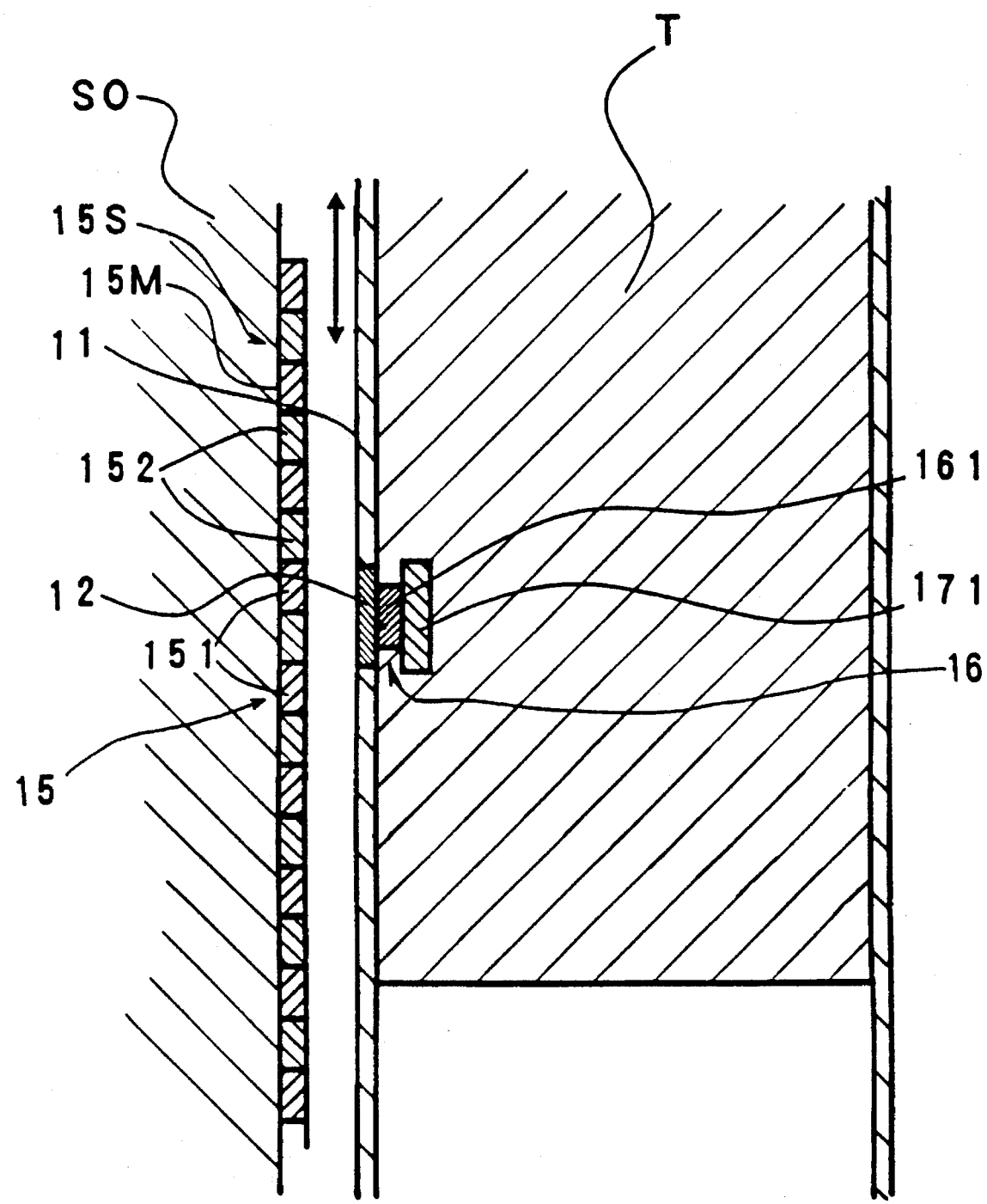
FIG. 16 is a longitudinal cross-sectional view showing a composite magnetic component for magnetic flux transmission as a fourth embodiment of the present invention and also a magnetic sensor as a sixth embodiment of the present invention.
Figure 17:
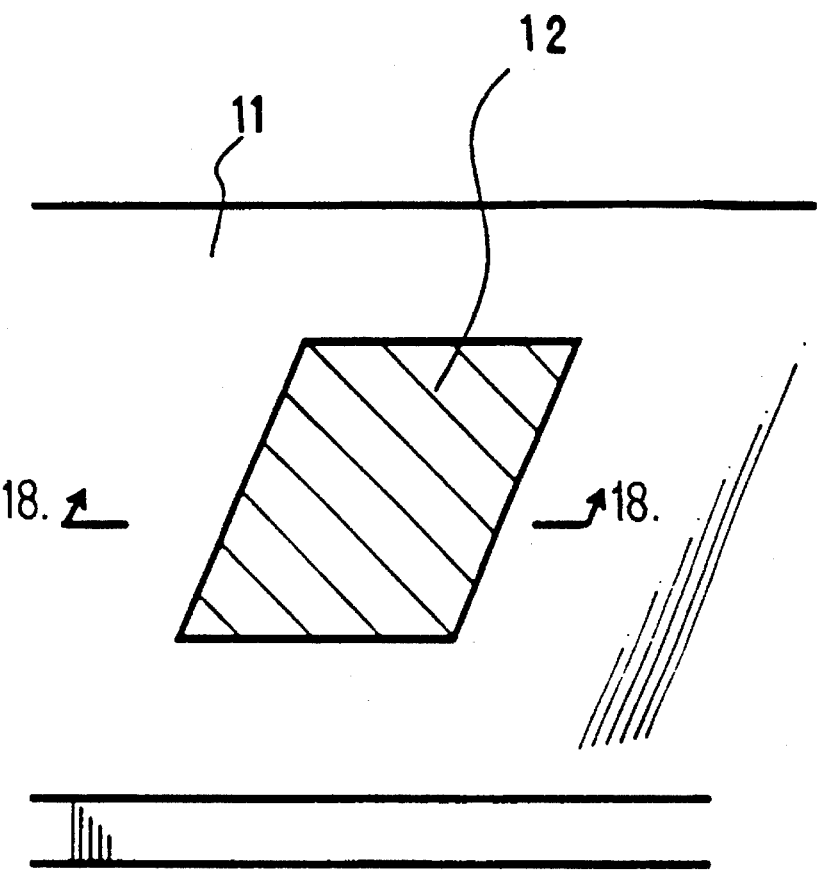
FIG. 17 is a perspective view showing a composite, magnetic component for magnetic flux transmission as the fourth embodiment.
Figure 18:
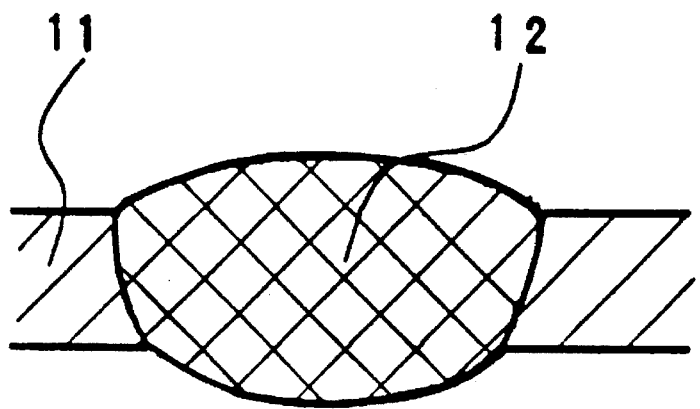
FIG. 18 is a cross-sectional view taken along line A—A in FIG. 17 and showing the composite magnetic component for magnetic flux transmission as the fourth embodiment.

FIGS. 16, 17 and 18 show a composite magnetic component for magnetic flux transmission as a fourth embodiment of the present invention. This component comprises a base member 11 made of S45C steel as a soft magnetic material and having a thickness of 1.5 mm. The base member 11 is integrally provided with non-magnetic region 12 as a rectangular region of 10 mm by 10 mm, which corresponds in position to and is greater in area than the area of a magnetic sensor to be described later, through composition modification in the entire thickness.

The non-magnetic region 12 serves as a commonly termed magnetic window which promotes the transmission of magnetic flux or other magnetic signals in the thickness direction and supplies the magnetic flux or other magnetic signals to the magnetic sensor.

In the composite magnetic component for magnetic flux transmission as the fourth embodiment having the above construction, since the non-magnetic region 12 is formed through composition modification of the portion of the base member 11 corresponding to the magnetic sensor, there is no notch, thereby ensuring high mechanical strength, unlike the prior art in which the non-magnetic region is formed by bonding. Thus, a use in case of applying a load is made possible.

Further, in the composite magnetic component as the fourth embodiment, since a portion of the component corresponding to the magnetic sensor is converted to the non-magnetic region 12 through composition modification, it is possible to use an inexpensive iron type usual material for the base member, compared to the prior art base member which is entirely made of an expensive non-magnetic material, so that the cost can be reduced to about one-fourth of that of the prior art.

Furthermore in the fourth embodiment, the base member 11 having the non-magnetic region 12 may be obtained by composition modification to one part as well as the third embodiment.

Fifth Embodiment

Figure 19:
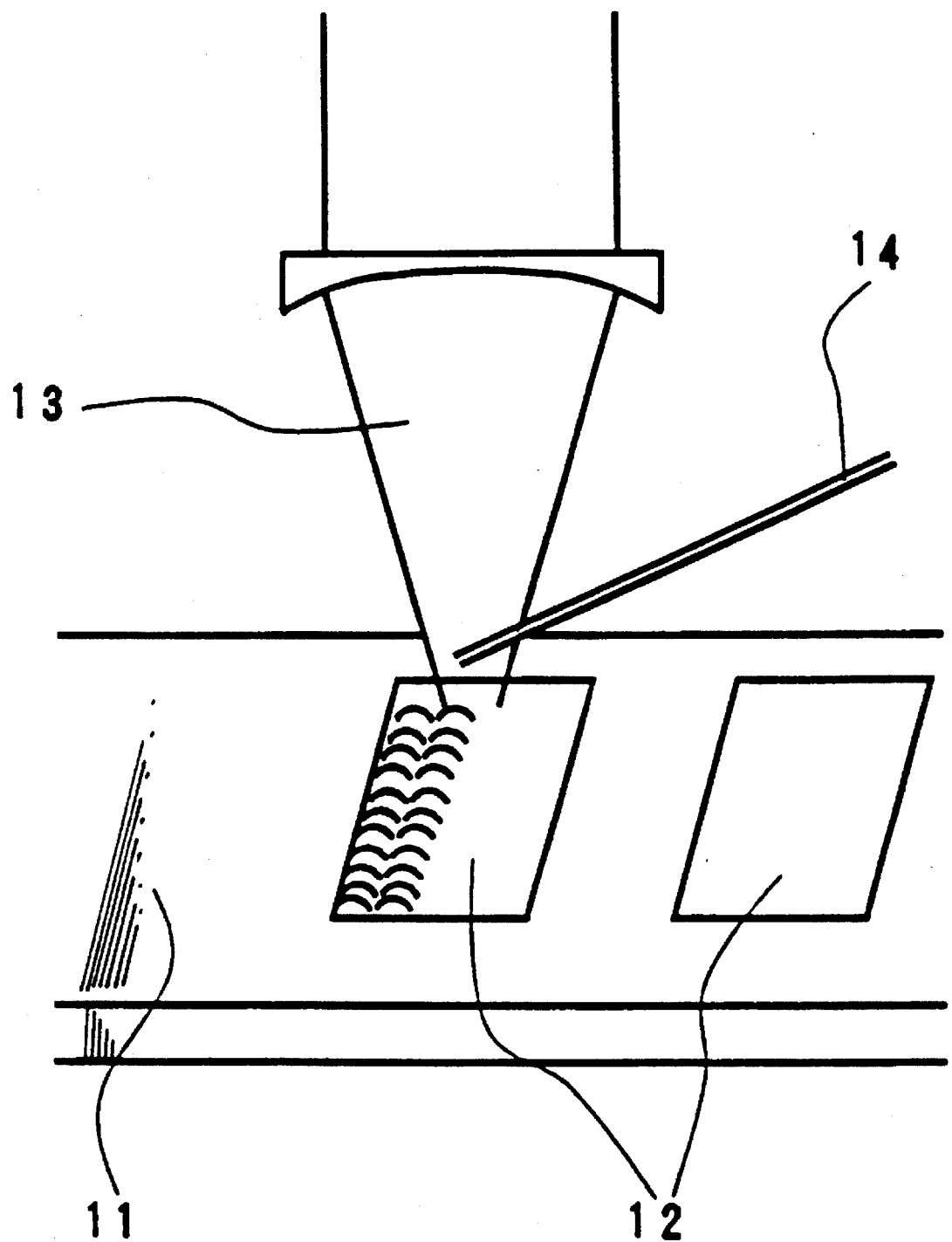
FIG. 19 is a view for explaining a method of manufacture as the second embodiment.

FIG. 19 shows a method of manufacturing a composite magnetic component for magnetic flux transmission as a fifth embodiment of the present invention. This embodiment concerns the method of manufacturing the composite magnetic component for magnetic flux transmission as the fourth embodiment. As shown in FIG. 19, a portion of a base member 11 of S45C steel, which corresponds to a magnetic sensor, is irradiated with a carbon dioxide gas laser beam 13 as an embodiment of energy beam with output power of 2.5 kW while feeding a 75Ni—20Cr alloy wire 14 of 1 mm in diameter. The composition modification rate by the laser beam is set to 1 m/min., and the wire feed rate is set to 2 m/min.

A linear region is modified in composition by one scan, and repeated laser beam scanning is controlled by overlapping composition-modified linear regions by a predetermined degree until the entire local region corresponding to the size of the magnetic sensor is modified in composition.

The composition modification for obtaining the non-magnetic region should be neither excessive nor insufficient. Otherwise, the non-magnetic region can not be formed. Thus, it is necessary to effect high degree balance control of the composition of the wire 14 fed during the laser beam irradiation, the diameter of the wire and the ratio between the rate of the composition modification by the laser beam and the feed rate of the wire.

The shape of the non-magnetic region is controlled through control of the quantity of heat input to the composition modification region (hereinafter referred to as heat input control), and the shape is basically determined by the output power of the laser beam 13 with respect to the material and thickness of the base member 11, and the material and diameter of the wire 14. Further, the shape is controlled also by the control of the rate of the composition modification by the laser beam and the feed rate of the wire.

Figure 20A:
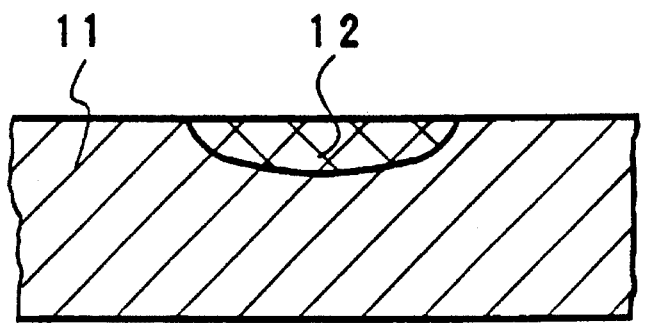
FIGS. 20(A), 20(B) and 20(C) are views for explaining heat input control in a method of manufacture as a fifth embodiment of the present invention, respectively.
Figure 20B:
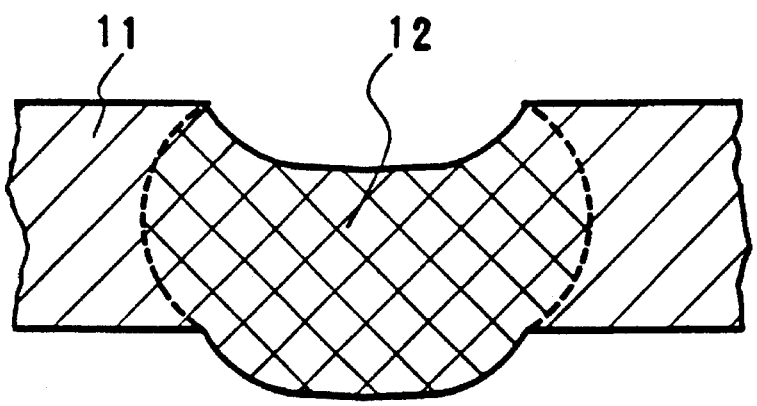
Figure 20C:
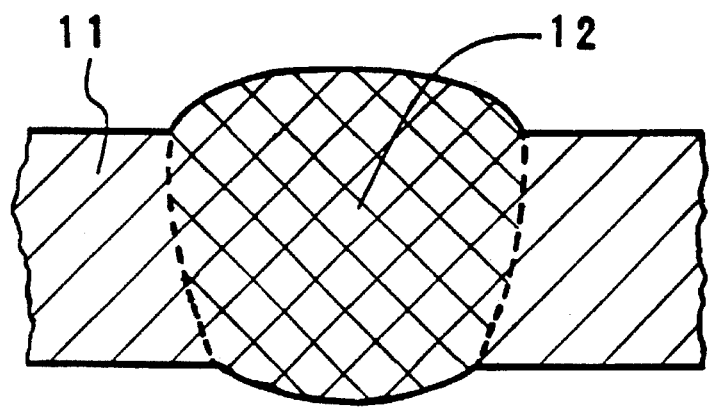

When the quantity of heat input is insufficient, only a superficial portion of the base member is modified in composition by the irradiation with the laser beam as shown in (A) in FIG. 20. On the other hand, when the quantity of heat input is excessive, the composition-modified region sort of sags down as shown in (B) in FIG. 20. When control is made properly, the entire region requiring composition modification is modified in composition, as shown in (C) in FIG. 20. Besides, there occurs no sagging.

In the fifth embodiment, it is important to control the composition of the non-magnetic region. Non-magnetization i.e. formation of non-magnetic region is attainable only when proper composition control is performed. To this end, however, high balance control should be effected with respect to the composition of the base member and supplied material, the supplied amount (volume) of the wire in response to the feed rate of the supplied wire, the welded volume of the base member in response to the composition modification rate by the laser beam, the ratio of an overlap section between one composition modification region and the adjacent composition modification region, when forming the window with a simple laser beam and various conditions.

For example, in case where a Ni type material is fed to the base member of Fe-0.10 (S10C) steel, non-magnetization can not be obtained when the feed rate is insufficient. While non-magnetization is obtainable by increasing the feed rate, the excessive increase of the feed rate results in a Fe-high Ni alloy type (commonly termed Permalloy type) alloy, that is, makes the non-magnetic region magnetic again. In order to prevent the non-magnetic region to be modified to magnetic again, it is proper to adopt the low Ni or Mn—Cr alloys as the fed material.

Further, the composition is greatly influenced by the volume of the base member to be melted. Thus, it is necessary for the non-magnetization to take an optimum balance with respect to the composition, the wire feed amount (volume) in response to feed rate of the supplied material and the composition, composition modification rate and composition modification volume of the base member. Further, synchronization of these factors through computer control is necessary for the composition modification.

The shape control of the non-magnetic region is based on the control of heat to be input, which is determined by the laser power, the quantity of heat input per unit time which is based on the beam traveling velocity by the laser, the heat capacity determined by the thickness of the base member which receives heat, the diameter of the wire, the rate of composition modification by the laser beam, and the wire feeding rate, and the laser beam heat absorption factor of the base member and the wire.

For example, in case where a Ni—Cr type alloy wire of 1 mm in diameter is fed to Fe-0.45C (S45C) steel, under the conditions of a laser beam output power level of 3 kW, a composition modification rate by the laser beam of 0.5 m/min., and a base member thickness of 1.5 mm, hole formation in the base member results. However, when the reduction of heat input quantity or the increase of composition modification rate is made properly for example the laser beam output power level of 2.0 kW, a composition modification rate by the laser beam 1.0 m/min, it is possible to obtain a satisfactory shape as shown in (C) in FIG. 20. Further, when the reduction of heat input quantity or the increase of composition modification rate is excessive, as shown in (A) in FIG. 20, it is impossible to obtain a sufficiently penetrating composition modification under the condition of a laser beam output power level of 3 kW and a composition modification rate of 5 m/min., or a laser beam output power level of 1.5 kW and a composition modification rate of 1 m/min.

It is important to effect non-magnetization in a desired shape, since the composition control and the heat input control should be made simultaneously, in particular, the volume of the modified composition in the composition control greatly depends on the heat input control.

Extensive researches and investigations were made concerning the relationship among various factors concerning the composition control for non-magnetization and the relationship among various factors concerning the heat input control with respect to the shape of the modified composition and, as a result, a non-magnetic member having a shape penetrating from the front to the back of the base member is obtained.

The base material of the composite magnetic component for magnetic flux transmission may be iron type magnetic usual steel or iron type soft magnetic material, and it is possible to utilize SC steel, SS steel, STKM steel and other varieties of steel.

The wire for composition modification which is fed during of the laser beam irradiation may be either of Ni materials, Ni-containing materials such as Ni—Cr type alloys, Fe—Ni—Cr alloys and Ni type stainless steel, manganese materials, Mn—Cr alloys and iron manganese materials.

In the method of manufacture as the fifth embodiment, since it is possible to obtain optimum composition control for obtaining the non-magnetic region, it is possible to obtain the optimum non-magnetic region.

Further, the method of manufacture as the fifth embodiment permits optimum shape control of the non-magnetic region through the above-mentioned heat input control.

Further, in the method of manufacture as the fifth embodiment, since accurate scanning control of the laser beam 13 is possible for the region formation, it is possible to form a region with an accurate shape in correspondence to the size and shape of the magnetic sensor and the status of distribution of the magnetic flux to be transmitted, comparing with the other energy beam such as an arc.

Further, in the method of manufacture as the fifth embodiment, since a non-magnetic region in a single place can be formed with a single laser beam irradiation, the cost of manufacture is inexpensive.

Sixth Embodiment

FIG. 16 shows a magnetic sensor device as a sixth embodiment of the present invention. This device incorporates a magnetic flux control member constituted by the composite magnetic component for magnetic flux transmission as the fourth embodiment manufactured by the method of manufacture as the fifth embodiment. As shown in FIG. 16, a magnet scale member 15S is provided on a member SO on one side. The magnet scale member 15S constitutes an output member 15 and has a magnet scale 15M having N and S of poles 151 and 152, respectively, which are arranged alternately at a fixed pitch. A member T on the other side is movable relative to the member SO on one side and provided with a magnetic reluctance element 161 constituting a magnetic sensor 16. The element 161 faces the magnet scale member 15S and has a slightly greater pitch than the pitch of the magnetic scale pole arrangement.

In the close proximity to the magnetic reluctance element 161, a magnetic flux control member 11 of the composite magnetic component for magnetic flux transmission as the fourth embodiment is disposed such that the non-magnetic region 12 faces the magnetic reluctance element 161. The member T is disposed in the member 11. The magnetic flux control member 11 constituted by the base member 11 is adapted to support a load on the upper end as a hollow cylindrical structure member.

A yoke 171 is disposed on the rear side of the magnetic reluctance element 1.61 to prevent the leakage of magnetic flux and permit the measurement with satisfactory sensitivity.

In the magnetic sensor device as the sixth embodiment having the above construction, the relative movement of the member SO to the magnetic flux control member 11 accommodating the other member T causes a change in the positive relation between the N and S poles of 151 and 152 on the side of the member SO and the non-magnetic region 12 in the magnetic flux control member 11 facing the magnetic reluctance element 161 of the magnetic sensor 16. Thus, every time the N pole 151 comes to face the non-magnetic region 12, magnetic flux provided as a positive magnetic signal from the N pole 151 is transmitted through the non-magnetic region 12 to be supplied to the magnetic reluctance element 161. The magnetic reluctance element 161 detects such magnetic flux to detect the extent of relative movement of the members SO and T to each other.

In the device as the sixth embodiment having the above action, the magnetic flux control member 11 causes the magnetic flux output from the N pole 151 of the magnetic scale 15M to effectively transmit through the non-magnetic region 12 to the magnetic sensor 16, and also the yoke 171 is provided on the back side. Thus, it is possible to effectively detect changes in the magnetic flux or the like, and permit highly accurate measurement.

Further, in the device as the sixth embodiment, unlike the prior art, the formation of the non-magnetic region 12 in the magnetic flux control member 11 does not result in the reduction of mechanical strength, and thus it is possible to permit applications, in which a load is applied to the magnetic flux control member 11.

Further, in the device as the sixth embodiment, since it is possible to use an inexpensive iron type usual material for the magnetic flux control member 11, the cost of the sensor device as a whole can be reduced.

The above embodiments are shown for the sake of description of the present invention, and not for the purpose of limiting the present invention, and modifications and additions are possible without departing from the technical concepts of the present invention which are perceived by the person having ordinary knowledge in the art from the statement in the claims.

While the first to third embodiments described above have concerned the yoke component of the magnetic sensor and the yoke member of the injection valve as embodiments of changing the flow direction of the magnetic flux in the closed magnetic circuit, they are by no means limitative, and the present invention is applicable as well to yoke components of motors, actuators, cylinder rods and so forth.

Further, while the fourth and sixth embodiments described above have concerned embodiments of forming the non-magnetic region in a portion of the component corresponding to the magnetic sensor, the present invention is generally applicable to such a case as obviates any magnetic sensor so long as it requires the magnetic flux to be transmitted.

Further, while the fourth embodiment has concerned an embodiment of usual laser beam irradiation as shown in FIG. 19, it is possible as well to adopt composition modification using a beam scan method, a cylindrical lens method or a kaleido scope method or like optical system according to the present invention.

Figure 21:
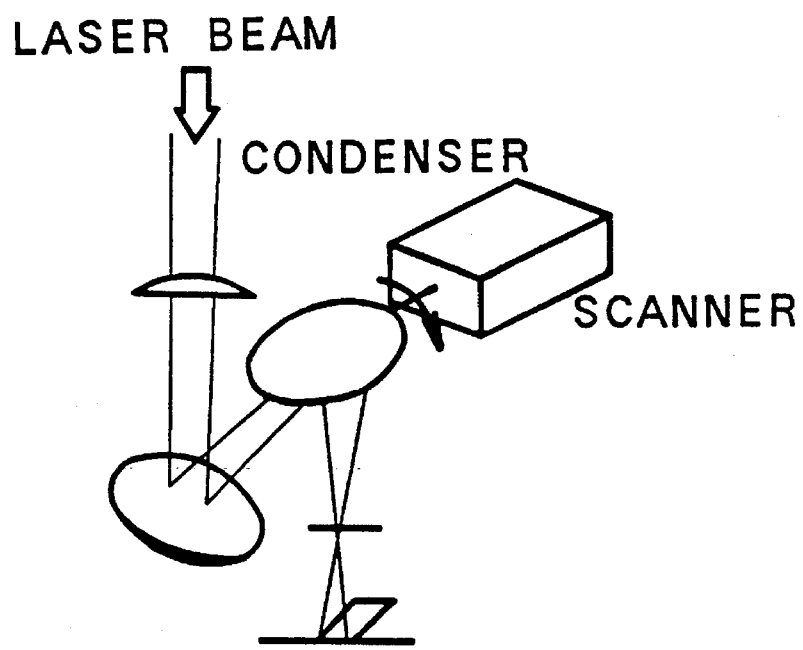
FIG. 21 is a view for explaining a method of manufacture as a modification of the fifth embodiment.

FIG. 21 illustrates the beam oscillation method. In this method, a non-magnetic region having a satisfactory penetrating shape is obtainable by the steps of removing a portion of 10 mm×10 mm×0.3 mm from a base member with a thickness of 1.5 mm, cladding a 75Ni—25Cr alloy sheet of 10 mm×0.3 mm to the base member corresponding to the removed part and modifying the sheet in composition under conditions of a laser power level of 2.7 kW, a beam oscillation amplitude of 10 mm, an beam oscillation frequency of 20 Hz and a feeding rate of 0.3 m/min.

In this method, a non-magnetic region having a satisfactory penetrating shape is further obtainable by the steps of removing a portion of 10 mm×10 mm×0.2 mm from a base member with a thickness of 1.7 mm, cladding a 75Ni—25Cr alloy sheet of 10 mm×0.6 mm to the base member corresponding to the removed part and changing the sheet in composition under conditions of a laser beam output power level of 2.4 kW, an beam oscillation amplitude of 10 mm, an beam oscillation frequency of 10 Hz and a feeding rate of 0.2 m/min.

Further more in this method a non-magnetic region is obtainable by steps of cladding a 75Ni—25Cr alloy sheet of 10 mm×0.6 mm to a base member with a thickness of 1.5 mm, and changing the sheet in composition on same condition above described.

Figure 22:
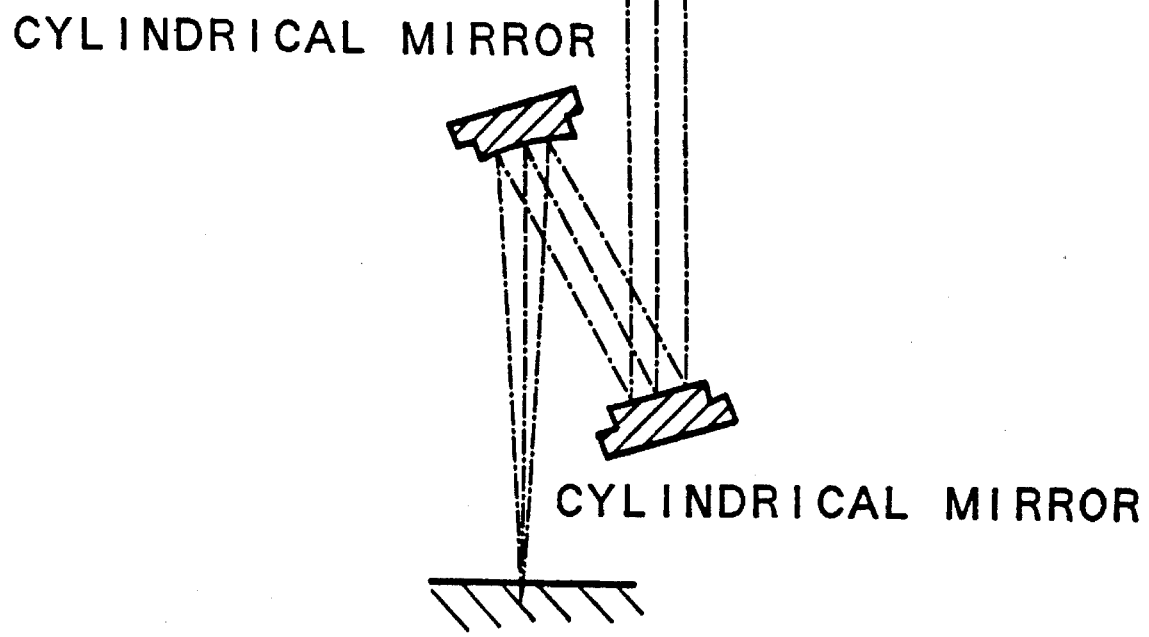
FIG. 22 is a view for explaining a method of manufacture as a modification of the fifth embodiment.

FIG. 22 illustrates a cylindrical lens process. In this process, a non-magnetic region having a satisfactory penetrating shape is obtainable by the steps of removing a portion of 10 mm×10 mm×0.1 mm from a base member with a thickness of 0.5 mm by use of a lens which can transmit a line beam of 10 mm in length, cladding a 75Ni—25Cr alloy sheet of 10 mm×0.1 mm to the base member corresponding to the removed part and modifying the sheet in composition under conditions of a laser beam output power level of 2.5 kW, a beam width of 10 mm, and a feeding rate of 0.2 m/min.

In this method, a non-magnetic region having a satisfactory penetrating shape is obtainable by the steps of removing a portion of 10 mm×10 mm×0.1 mm from a base member with a thickness of 0.5 mm by use of a lens which can transmit a line beam of 10 mm in length, cladding a 75Ni—25Cr alloy sheet of 10 mm×0.36 mm to the base member corresponding to the removed part and changing the sheet in composition under conditions of a laser power level of 2.0 kW, a beam width of 10 mm, and a feeding rate of 0.2 m/min.

In the above embodiments, while the carbon dioxide gas laser beam has been described in view of the accuracy of composition modification in the atmosphere and the mass production as an example of energy beam, it is possible to use other energy beams as well, for instance, a Y.A.G. laser, an arc, an electron beam or the like according to the present invention.

Further, in the above sixth embodiment, while the magnetic reluctance element has been described as a magnetic sensor, this is by no means limitative, and the present invention is applicable as well to a Hall element, a pick-up coil and so forth.

Further, in the above sixth embodiment, while the magnetic scale member with the magnetic scale has been described, the present invention is applicable as well to a case where a magnetic scale having a magnetic scale portion other than a magnet is utilized, while using a magnet disposed on the sensor side.

What is claimed is:

1. A method of manufacturing a composite magnetic component, comprising:

irradiating, with an energy beam, a portion of a magnetic base member made of a magnetic material, while feeding a feed metal for forming a non-magnetic region to said portion for composition modification in the entire thickness thereof, so that said non-magnetic region has a magnetic flux property modified from that of said magnetic base member.

2. The method of manufacturing a composite magnetic component according to claim 1, wherein:

the feed metal for forming the non-magnetic region is a member selected from the group consisting of Ni, Mn, Ni alloys, Mn alloys, Mn—Cr alloys and Fe alloys, depending on the material of the magnetic base member.

3. The method of manufacturing a composite magnetic component according to claim 1, wherein:

said energy beam is a beam capable of melting the magnetic base member in the entire thickness thereof.

4. The method of manufacturing a composite magnetic component according to claim 3, wherein:

said energy beam is a member selected from the group consisting of a laser beam, an arc, and an electron beam.

5. The method of manufacturing a composite magnetic component according to claim 4, wherein:

said energy beam is a laser beam and is used in accordance with any one of a direct irradiating method, a beam scan method, a cylindrical lens method, or a kaleidoscope method.

6. The method of manufacturing a composite magnetic component according to claim 4, wherein:

said energy beam is a laser beam and said laser beam is selected from the group consisting of carbon dioxide gas laser beams and Y.A.G. laser beams.

7. A method of manufacturing a yoke component with integral soft magnetic and non-magnetic parts according to claim 1, wherein:

a portion of said yoke component made of a soft magnetic iron alloy constituting said magnetic base member is provided with a non-magnetic region as a magnetic flux blocking section, which is given a magnetic flux blocking property through composition modification effected by irradiating a laser beam to said portion in the thickness direction while feeding thereto a feed metal selected from the group consisting of Ni, Mn, Ni alloys, Mn alloys, Mn—Cr alloys, Ni—Cr alloys and Fe alloys.

8. A method of manufacturing a composite magnetic component for magnetic flux transmission according to claim 1, wherein:

a member of an iron type magnetic material constituting said magnetic base member has at least a portion facing a magnetic sensor integrally provided with a non-magnetic region for magnetic flux transmission by irradiating, with a laser beam, said portion while feeding a material containing a member selected from the group consisting of Ni, Mn, Ni alloys, Mn alloys, Mn—Cr alloys, Ni—Cr alloys Fe alloys, and mixtures thereof.

9. The method of manufacturing a composite magnetic component for magnetic flux transmission according to claim 1, wherein:

composition is controlled in the formation of said non-magnetic region.

10. The method of manufacturing a composite magnetic component for magnetic flux transmission according to claim 1, wherein:

heat input is controlled in the formation of said non-magnetic region.

* * * * *